United States Patent [19]

Merrin

[11] 3,921,191

[45] Nov. 18, 1975

[54] PHOTORESPONSIVE JUNCTION DEVICE HAVING AN ACTIVE LAYER OF ALTERED CONDUCTIVITY GLASS

[75] Inventor: Seymour Merrin, Fairfield, Conn.

[73] Assignee: Innotech Corporation, Norwalk, Conn.

[22] Filed: Nov. 22, 1974

[21] Appl. No.: 526,165

Related U.S. Application Data

[60] Division of Ser. No. 227,932, Feb. 22, 1972, and a continuation-in-part of Ser. No. 122,422, March 9, 1971.

[52] U.S. Cl. .......................... 357/2; 357/30; 357/4

[51] Int. Cl.[2] .......................... H01L 45/00

[58] Field of Search .......................... 357/30, 2, 4

[56] References Cited

UNITED STATES PATENTS

| | | | |
|---|---|---|---|
| 3,451,126 | 6/1969 | Yamamoto | 29/576 |
| 3,507,646 | 4/1970 | Wood | 96/1 |
| 3,564,353 | 2/1971 | Corak | 317/234 |
| 3,656,032 | 4/1972 | Heinisch | 317/234 |
| 3,794,835 | 2/1974 | Hirai | 250/211 J |

OTHER PUBLICATIONS

Kolomietz et al., Revue de Physique, No. 2, pp. 129–131, 1970, (Bucharest).

*Primary Examiner*—Martin H. Edlow
*Attorney, Agent, or Firm*—Pennie & Edmonds

[57] ABSTRACT

The conductivity of a body of ionically impermeable glassy amorphous material is controllably altered by driving or diffusing suitable impurities into the body of material. Impurities are driven into the glassy body by, for example, disposing a source of impurity ions on the surface and applying an electric field across the body. Preferably, the glassy amorphous material is heated so that its temperature is above a thermal diffusion temperature characteristic of the particular material and the particular impurity but is below the temperature at which an appreciable proportion of the impurities would be structurally incorporated into the material. Alternatively, impurities can be driven into a glassy body by ion bombardment. And in some material-impurity combinations, it is sufficient merely to heat the material above the thermal diffusion temperature in the presence of the dopant. The method provided by the invention can be used to render insulating glassy materials effectively semi-conducting or to alter the conductive properties of glassy semiconductors. It can thus be used to produce a wide variety of bulk semiconductor devices such as switches as well as single junction and multiple junction semiconductor devices.

6 Claims, 9 Drawing Figures

PHOTORESPONSIVE JUNCTION DEVICE HAVING AN ACTIVE LAYER OF ALTERED CONDUCTIVITY GLASS

CROSS REFERENCES TO RELATED APPLICATIONS

This is a division of application Ser. No. 227,932 filed Feb. 22, 1972, and a continuation-in-part of U.S. Application, Ser. No. 122,422 filed by the same inventor on Mar. 9, 1971.

BACKGROUND OF THE INVENTION

The present invention relates to a method for controllably altering the conductivity of a body of glassy amorphous material and electronic devices which can be produced thereby.

The term glassy amorphous material, within the context of this description, defines those materials which typically exhibit only short-term ordering. The term is intended to include not only glasses, but also those "amorphous" materials which have any appreciable short-range ordering. However, it is intended to exclude both crystalline substances (such as silicon and silicon dioxide) and true amorphous materials having no appreciable ordering.

Glasses which comprise a specific class of glassy amorphous materials are typically quenched liquids having a viscosity in excess of about $10^8$ poise at ambient temperature. They are generally characterized by: (1) the existence of a single phase; (2) gradual softening and subsequent melting with increasing temperature, rather than sharp melting characteristics; (3) conchoidal fracture; and (4) the absence of crystalline X-ray diffraction peaks.

While the desirability of using glassy amorphous material in semiconductor devices has been long recognized, the development of semiconductor devices employing such materials has met only with limited success despite an intensive research effort. It is well known, for example, that glasses are easier to work with and less expensive compared with conventional crystalline semiconductors. However, many glassy amorphous materials are insulating materials. Thus, for example, typical oxidic glasses (glasses formed predominantly of oxide components) have not been considered useful in semiconductor devices because of their high resistivities and large band gaps.

Principally, three compositional groups of glasses have heretofore been found to possess sufficient conductivity to be classed as "semiconducting:" the chalcogenide-halogenide glasses, the phosphate-borate-vanadate glasses, and the electro-optical glasses. Of these special composition glasses, only the chalcogenide glasses have been employed in workable semiconducting devices.

Moreover, glassy materials have historically been difficult materials in which to maintain compositional gradients of impurities. As a consequence, glassy devices utilizing sharply defined compositional gradients—such as those used in semiconductor junction devices—were not generally considered feasible because it was expected that any impurities would diffuse into the surrounding regions in a relatively short time.

For this reason, prior art devices using the above-mentioned semiconducting glasses have generally utilized only the bulk properties of the glass rather than junctions or junction-like effects.

SUMMARY OF THE INVENTION

In accordance with the invention, the conductivity of a body of ionically impermeable glassy amorphous material such as glass is controllably altered by driving or diffusing suitable impurities into the body of material. Impurities are driven into the glassy body by, for example, disposing a source of impurity ions on the surface and applying an electric field across the body. Preferably, the glassy material is heated so that its temperature is above a thermal diffusion temperature characteristic of the particular material and the particular impurity but is below the temperature at which an appreciable proportion of the impurities would be structurally incorporated into the material. Alternatively, impurities can be driven into a glassy body by ion bombardment. And in some material-impurity combinations, it is sufficient merely to heat the material above the thermal diffusion temperature in the presence of the dopant. The method provided by the invention can be used to render insulating glassy materials effectively semiconducting or to alter the conductive properties of glassy semiconductors. It can thus be used to produce a wide variety of bulk semiconductor devices such as switches as well as single junction and multiple junction semiconductor devices.

BRIEF DESCRIPTION OF THE DRAWINGS

The advantages, nature, and various additional features of the present invention will appear more fully upon consideration of the illustrative embodiments now to be described in detail in connection with the accompanying drawings.

In the drawings.

DETAILED DESCRIPTION

Figure 1:
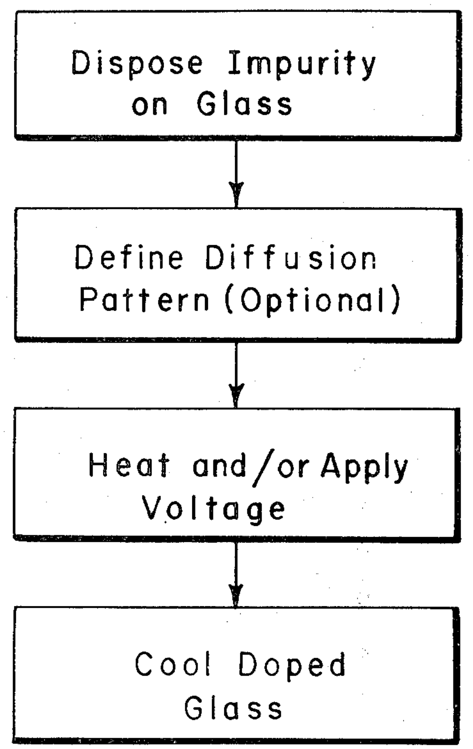
FIG. 1 is a flow diagram showing the process steps used to controllably alter the conductivity of a glassy body in accordance with one embodiment of the invention.

Referring to the flow diagram of FIG. 1, the first step in altering the electronic conductivity of a body of a glassy amorphous material with one embodiment of the invention involves disposing adjacent a surface of the body a source of impurities. The impurities can be deposited on the body by any one of a wide variety of techniques including vacuum evaporation, sputtering, or the application of solutions.

The term "impurities" as used herein is not limited to donor or acceptor impurities as used in the crystalline semiconductor art. Preliminary experiments indicate that a wide variety of materials—metallic as well as non-metallic—can be used as a source of ions which will alter the conductivity of a glassy amorphous material. Sources of metallic ions having more than one valence state (such as copper) are particularly useful for increasing conductivity. Where metallic impurities are desired, the impurity source can comprise a layer of the metal itself; and, where non-metallic impurities are desired, the source can, for example, comprise an ionic compound such as a salt containing the desired impurity. Where bulk photoconductive effects are desired, the impurity can be a photoconductive material such as, for example, zinc, silver, or selenium.

Advantageously, th glassy body is in the form of a smooth flat plate or a continuous film disposed on a supporting substrate. In a preferred embodiment, the substrate is conveniently a conductive material such as conductively doped silicon or a metal, and the glassy material is a thin continuous film of glass. Thin glass films having thicknesses of a few microns or even less can be coated on the substrate by known techniques such as sedimentation or sputtering.

In applications where it is desired either to effect reproducible changes in the conductivity of the glassy body or to maintain compositional gradients of impurities therein, the glassy material should be of a composition which is ionically impermeable both to ions of the impurity and to ions of typical ambient materials, such as sodium, at the anticipated operating temperatures and voltages. For these purposes, a glassy layer may be considered as ionically impermeable for typical applications if a capacitor using the layer as a dielectric does not show an appreciable shift in the room temperature capacitance-voltage characteristic after having been heated to the anticipated operating temperature in the presence of the aforementioned materials, and biased at the anticipated operating voltage for a period of about 100 hours.

In general, glassy materials made predominantly from components forming ionically impermeable crystalline phases are also ionically impermeable. Useful materials include compositions of both insulating glasses and semiconducting glasses.

Because typical glass melts retain a degree of structure from the phases (compounds) from which they are formed, the glasses made predominantly from compositions of ionically impermeable crystalline phases will generally also be ionically impermeable. It has also been observed that phases which have as their main structural element a linear chain-like element such as alkaline earth metasilicates are generally ionically impermeable and cool to form ionically impermeable glasses. (Typical common examples of such phases include $PbSiO_3$, $Pb_6Al_2Si_6O_{21}$, $ZnB_2O_4$, and $Zn_2SiO_4$.) Generally, glasses comprising more than 50 mole per cent of such phases will be relatively good barriers to ionic contaminants, and glasses comprising 70 mole per cent or more are excellent barriers.

Typically additional components may be added to the phase in small quantities without destroying the impermeability of the resulting glass. For example, in silicate glasses, $Al_2O_3$ may be typically added to the glass in quantities up to 20 mole per cent to vary the softening temperature or coefficient of thermal expansion. Alternatively, $B_2O_3$, $V_2O_5$, or $P_2O_5$ can be added to the silicate in quantities up to 20 mole per cent to vary the electronic conduction mechanism within the glass. These components fit into a silica site without significantly altering the glass structure.

Insulating ionically impermeable glassy amorphous materials (i.e., materials having a specific resistivity at or above about $10^{12}$ ohm-cm) are preferred because they have insulating properties at least comparable with $SiO_2$ (the specific resistivity of which is about $10^{16}$ ohm-cm). Such materials can typically be used in place of $SiO_2$ as passivating layers in conjunction with conventional crystalline semiconductor devices or integrated circuits. These materials are typically insulating glasses of the broad lead silicate family (i.e., the family including modified and unmodified lead silicates) and the broad zinc silicate families.

Especially preferred are insulating ionically impermeable glasses which are thermally compatible with typical crystalline semiconductor devices, that is, insulating glasses which have a temperature coefficient of expansion compatible with that of typical semiconductor substrates and have softening temperatures below the damage temperature of typical diffused junction semiconductor devices. These glasses are found, for example, in the more narrowly defined families of the lead-boro-alumino silicates, the zinc-boro silicates, and the zinc-boro-alumino silicates.

Specific examples of preferred glass compositions are given in Tables I–IV. For sedimentation depositions, the oxide components of the preferred glass composition are listed in Table I. Below each listed preferred percentage is a range (in brackets) of acceptable percentages:

TABLE I

| | | |
|---|---|---|
| $SiO_2$ | 6.6<br>( 3–12) | mole per cent |
| ZnO | 55.3<br>(45–65) | " |
| PbO | 2.7<br>(0–6) | " |
| $B_2O_3$ | 34.5<br>(25–40) | " |

where calcium oxide, barium oxide, or strontium oxide or a mixture thereof can be substituted for ZnO in an amount up to 10 mole per cent.

An alternative and satisfactory composition for a glass for sedimentation deposition is given in Table II:

TABLE II

| | | |
|---|---|---|
| $SiO_2$ | 60<br>(55–65) | mole per cent |
| PbO | 35<br>(30–40) | " |
| $Al_2O_3$ | 5<br>(0–7) | " |

where $B_2O_3$, $V_2O_5$, or $P_2O_5$ or a mixture thereof can be substituted for $SiO_2$ and ZnO can be substituted for PbO, each substitution being limited to 20 mole per cent.

For RF sputtering deposition, the components for a preferred glass composition are listed in Table III:

TABLE III

| | | |
|---|---|---|
| $SiO_2$ | 46.15<br>(35–55) | Mole per cent |
| PbO | 46.15 | " |

TABLE III-continued

| | | |
|---|---|---|
| $Al_2O_3$ | (35–60)<br>7.70<br>( 0–20) | " |

where $B_2O_3$, $V_2O_5$, or $P_2O_5$ or a mixture thereof can be substituted for $SiO_2$ and ZnO can be substituted for PbO, each substitution limited to 20 mole per cent.

An alternative and satisfactory composition for a glass for either sedimentation or RF sputtering deposition is given in Table IV:

TABLE IV

| | | |
|---|---|---|
| $SiO_2$ | 10<br>( 5–15) | mole per cent |
| Zno | 55.5<br>(50–65) | " |
| $B_2O_3$ | 34.5<br>(25–35) | " |

where calcium oxide, barium oxide, strontium oxide or a mixture thereof can be substituted for ZnO in amounts up to 10 mole per cent, and PbO can be substituted for ZnO in amounts up to 20 mole per cent.

These glasses can be formed in accordance with conventional techniques well known in the art. (For preparing the glasses for sedimentation, see, for example, the technique described by W. A. Pliskin in U.S. Pat. No. 3,212,921 issued on Oct. 19, 1965.)

If it is desired to make glass layer 10 of submicron thickness (as might be required, for example, where the glass is also used as a dielectric layer in adjacent surface effect devices), the centrifuging technique disclosed in applicant's copending application, Ser. No. 859,012, filed Sept. 16, 1969, can be used to produce the thin glass layer.

The second step which is optional in some applications involves defining the transverse diffusion pattern. This can be accomplished, for example, by using conventional photoetching techniques to remove unwanted portions of the impurity coating or by defining the desired transverse pattern on an electrode for applying a voltage across the glassy body. Clearly, photoetching is preferable where the diffusion pattern is complex and disconnected. Alternatively, in the initial step, the impurity can be selectively deposited on only the desired portions of the surface of the glassy body by, for example, masking or otherwise protecting the remaining portions. Where it is desired to alter the conductivity of the entire body, this definitional step is, of course, unnecessary.

The third step involves heating the impurity coated glassy body and/or applying a voltage across it to diffuse or to drive a sufficient number of impurity ions into the glassy amorphous material to increase its conductivity to a preselected level. Typically, it will be increased so that it falls in the useful semiconducter range. Thus, in typical applications using glasses formed predominantly of oxide components, the resistivity of the oxide-component glass will be lowered from a value in the range between $10^{14}$ and $10^{22}$ ohm-cm to a value between $10^{-2}$ and $10^{12}$ ohm-cm. Glassy materials having resistivities in the latter range will be referred to as materials having useful conductivity. Where the glassy material is initially semiconductive, the impurity ions will further increase the conductivity.

In the usual case, it is necessary to both heat the glassy body to at least the thermal diffusion temperature for the particular impurity in the particular material and, at the same time, apply a voltage across it. The thermal diffusion temperature is empirically defined as the threshold temperature at which the glassy material changes from ion impermeable to ion permeable for the particular impurity. Relatively small increments in temperature above this thermal diffusion temperature produce large increments in the diffusion rate.

It is clear that temperatures above the diffusion temperature are generally used when no voltage is used or when the voltage is much smaller than the breakdown voltage. For a several microns thick layer of a glass having oxide components in the mole ratio of 6:1:6 of PbO, $Al_2O_3$, and $SiO_2$, it has been found that the application of 10 to 20 volts at a temperature of 225°–250°C. drives ions of aluminum into the glass very rapidly while there is no appreciable diffusion of aluminum at 175° C. Copper, under the influence of the same electric field, diffuses into the glass very rapidly at 175° C.

Since different materials have different diffusion temperatures, it is clear that multiple diffusions can be effected by successive diffusion steps beginning with the dopant having the highest diffusion temperature and ending with the dopant having the lowest diffusion temperature.

It has also been found that, in some cases, it is possible to dispense either with the heating of the glassy body or the application of voltage. Where the diffusion temperature of the impurity is on the order of room temperature or lower, it is clear that the application of voltage alone will drive ionic impurities into the material. In such cases, the process merely involves applying a sufficient voltage for a sufficient period of time to increase the conductivity of the glassy material to a level in the semiconductor range. On the other hand, where the material is heated considerably beyond its diffusion temperature in the presence of impurity ions, the impurities tend to diffuse into it even without a driving voltage. For temperatures below the thermal diffusion temperature, the diffusion rates are generally too slow to be useful although some results can ultimately be obtained if sufficient diffusion times are used.

The glassy material should not be heated to a temperature at which the diffused ions will be structurally incorporated into the material rather than disposed in interstitial positions. When the ions are structurally incorporated into the material, they are essentially surrounded by portions of the polymeric member having the opposite charge. When they are interstitially disposed in the material, however, they are disposed in essentially random positions. The structural incorporation temperature may be defined as the temperatures at which there is appreciable bond breaking and polymer reforming within the glassy material. It is always below the melting temperature of a glass and typically below the temperature at which appreciable softening takes place.

The fourth step involves cooling the doped glassy body and removing the driving voltage to lock-in the impurities.

After the material has cooled, it is found that its conductivity has increased due to the presence of the impurities. In particular, it is found that the introduction of relatively small amounts of conductive impurities interstitially within the glassy material without heating the material to the structural incorporation temperature produces an increase in conductivity many times greater than the increase produced by adding a corresponding amount of conductive impurities to the glass melt. While the applicant does not claim to completely understand this phenomenon and does not wish to be bound by any particular theory, it is believed that glasses and other glassy amorphous materials are composed of a polymeric structural member with relatively long short-range structures, but disordered and distorted. The polymeric members are held together in many instances by ions which electrically neutralize the body of the material. In many instances, the polymeric member has physical protrusions which form part of the coordination ions of the joining ion and consequently impede the flow of electrons. For instance, in a typical oxide component glass such as a boro-silicate glass electrons cannot easily flow among the structurally incorporated modifier cations because the oxygen atoms of adjacent silicates or borates tend to surround the cations and form a potential barrier to electron flow. The introduction of impurity ions into interstitial positions at a temperature below the structural incorporation temperature however tends to force the oxygen atoms away from the modifiers and thus reduce the potential barriers. These interstitially introduced ions may be thought of as randomly distributed conductive bridges between adjacent regions of short-range crystalline order.

A second method for introducing impurities interstitially into a glassy body and thereby altering its conductivity involves bombarding the surface of the body with impurity ions using the ion implantation technique developed for use on crystalline semiconductors. While bombarding ions seriously damage the crystal structure of conventional semiconductors, they do not seriously damage glassy substrates because they have no long range order.

Figure 2:
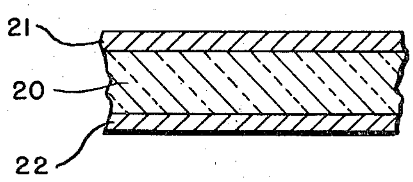
FIG. 2 is a schematic cross section of a glassy semiconductor device, useful in performing switching or memory functions, made in accordance with the invention.

FIG. 2 is a schematic cross section of a simple glassy switching device made in accordance with the invention. The device comprises, in essence, a body of a glassy amorphous material 20 (typically a thin layer of glass on the order of a few microns thick) disposed between a pair of contact electrodes 21 and 22. The glassy material has been doped with a sufficient concentration of impurities such as copper ions to produce useful conductivity. In contrast with typical prior art glass switches, the glassy material can be an insulating oxidic glass such as a lead silicate or a zinc silicate. Moreover, the glass can be chosen to be thermally compatible with typical crystalline semiconductor substrates.

The device can be conveniently fabricated by the steps of forming the glassy body, driving the ion impurities thereinto, and disposing electrical contacts on the body. These steps need not be performed in sequence. For example, in a convenient way of fabricating the switch, an electrode 21 of the dopant metal is disposed on one side of a glass layer, and an electrode 22 of a second metal such as gold which is not mobile in the glass at ambient temperature is applied to the other side. After the dopant is diffused into the glass, the previously insulating glass is conductive in the direction of the bias voltage. However, if the voltage polarity is reversed, the glass switches back to the insulating state and will not conduct again until a threshold voltage in the bias direction is applied. After the threshold voltage is applied, the device switches back to its conducting state. This device can be used, for example, to perform both switching and memory functions.

As a specific example of such a switch, a few microns of a glass having oxide components of PbO and $SiO_2$ in a 1:1 ratio and including 1 mole per cent of $V_2O_5$ in the melt was deposited on a conductive metal substrate by the sedimentation technique. A few thousand angstroms of chromium were deposited on the glass and the resulting structure heated to 500° C. for about 5 minutes. A copper dot was then evaporated on the top of the fired structure for the top electrode. This device exhibited switching characteristics at temperatures from room temperature to temperatures in excess of 100° C.

Figure 3:
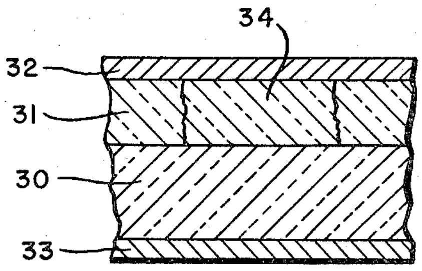
FIG. 3 is a schematic cross section of a glassy semiconductor-crystalline semiconductor diode made in accordance with the invention.

FIG. 3 is a schematic cross section of a self-passivating glassy junction diode which includes an active layer of glassy amorphous material forming the junction. The device comprises a crystalline semiconductor substrate 30 doped to exhibit one type of conductivity (e.g., N-type conductivity), a glassy layer 31 disposed on the substrate and doped in region 34 to exhibit the second type of conductivity (e.g., P-type), and a pair of electrodes 32 and 33 disposed in contact with the semiconductor and doped glass, respectively. The glassy layer 31 is preferably extended beyond the doped region to produce a self-passivated junction.

Figure 4:
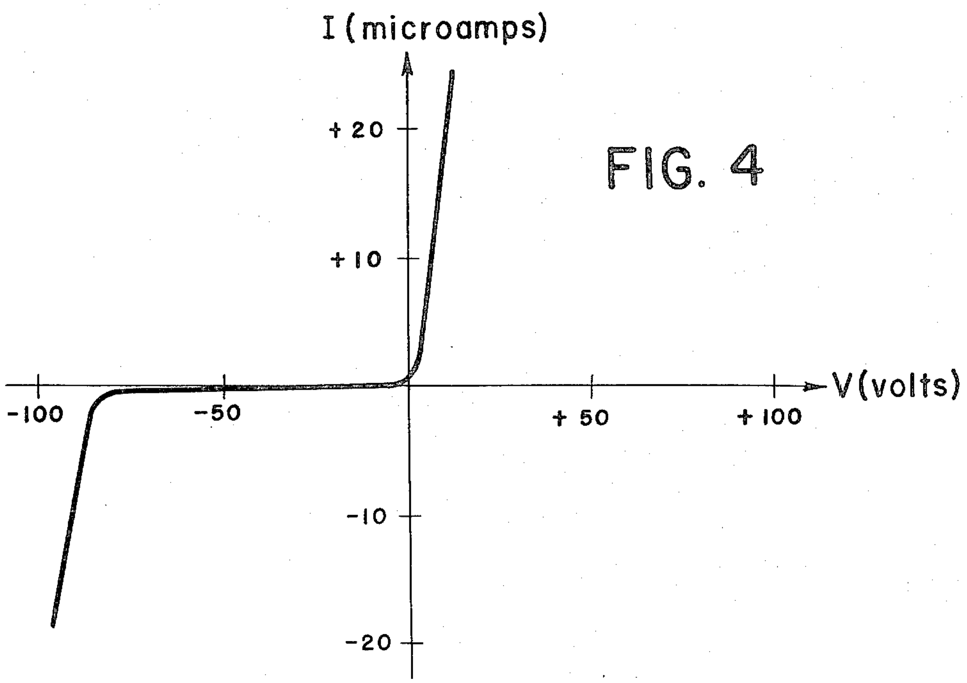
FIG. 4 is a graphical illustration showing the current-voltage characteristic of a typical diode of the form shown in FIG. 3.

A specific example of such a diode will now be described in detail. A several microns thick layer of the aforementioned 6:1:6 lead-alumino silicate glass is deposited on an N-doped silicon wafer by the well-known sedimentation process. A thin layer of copper having a thickness on the order of a few thousand angstroms was deposited on the glass by vacuum evaporation, and the resulting structure was heated to 450° C. for about 30 minutes. After the outer layer of copper oxide was removed, the structure acted as a diode having the current-voltage characteristics shown in FIG. 4. This junction exhibited some photosensitivity.

Figure 5:
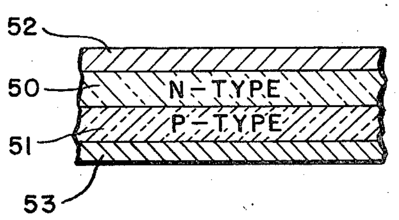
FIG. 5 is a schematic cross section of a multiple layer glassy diode.

FIG. 5 is a schematic cross section of a glassy layer junction-type diode comprising a layer 50 of N-type glassy material doped with impurities to give it useful conductivity and a layer 51 of a P-type glassy material which is also doped with impurities to give it useful conductivity. For example, the N-type glassy layer can be a 1:1 PbO-$SiO_2$ glass melted with less than 15 mole per cent of $V_2O_5$ or with less than 15 mole per cent of $P_2O_5$. The P-type glassy material can be the aforementioned 6:1:6 glass. The diffusants to be used in the P-type glass can be chosen from among most typical metals such as, for example, chromium, copper, silver, or zinc. Electrodes 52 and 53 provide electrical contact with the structure.

This structure has been found to exhibit diode characteristics. It is also photosensitive and can therefore be used as a photodiode.

Figure 6:
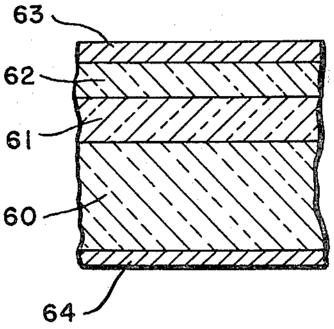
FIG. 6 is a cross section of a glassy multiple junction device.

FIG. 6 is a schematic cross section of a glassy multiple junction device comprising at least three successive active layers of alternating types of conductivity forming at least two diode junctions thereamong, at least one of which active layers is a glassy material. In particular, the illustrative embodiment comprises a substrate 60 doped to exhibit one type of conductivity (e.g., P), a first layer 61 of glassy material of the second kind of conductivity (e.g. N) disposed thereupon, and a second layer 62 of a glassy material having the same kind of conductivity as the initial semiconductor layer disposed on the first glassy layer. Each of the two glassy layers are interstitially doped as described hereinabove to exhibit useful conductivity. A pair of electrodes 63 and 64 are conveniently applied to permit electrical contact with the structure. Electrically the structure exhibits a PNP characteristic showing diode characteristics for applied voltages of either polarity.

Figure 7:
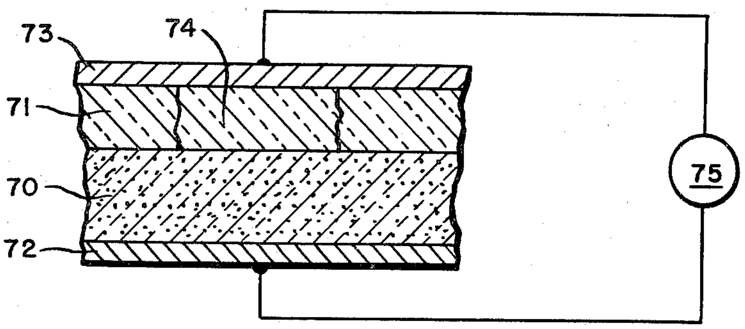
FIG. 7 is a schematic cross section of a glassy semiconductor diode especially adapted for use as a photoresponsive device.

FIG. 7 is a schematic cross section of a glassy junction diode which includes an active layer of glassy amorphous material forming the junction and which is adapted to operate as a photodiode. The device comprises a semiconductor substrate 70 doped to exhibit one type of conductivity (e.g., N-type conductivity), a glassy layer 71 disposed on the substrate and doped in region 74 to exhibit the second type of conductivity (e.g., P-type), and a pair of electrodes 72 and 73 disposed in contact with the semiconductor and doped glass, respectively. Semiconductor substrate 70 can be a conventional crystalline semiconductor such as monocrystalline silicon, a polycrystalline semiconductor, or another doped glassy layer. One of the electrodes, conveniently electrode 73, can be formed of transparent conductive material such as tin oxide so that the glass-silicon junction can be exposed to light.

For the reasons previously discussed in detail, the preferred glassy amorphous materials are the above-described insulating ion-impermeable glasses.

A specific example of such a diode will now be described in detail. A several microns thick layer of the aforementioned 6:1:6 lead-alumino-silicate glass was deposited on an N-doped silicon wafer by the well-known sedimentation process. A thin layer of copper having a thickness on the order of a few thousand angstroms was deposited on the glass by vacuum evaporation and the resulting structure was heated to 450° C. for about 30 minutes. After the outer layer of copper oxide was removed, the structure acted as a diode.

As a second example, the substrate can comprise a thin layer of an N-type glass such as 1:1 $PbO$-$SiO_2$ glass melted with less than 15 mole per cent of $V_2O_5$ or with less than 15 mole per cent of $P_2O_5$. The P-type glassy material can be the above mentioned 6:1:6 glass. The diffusants to be used in the P-type glass can be chosen from among most typical metals such as chromium, copper, silver, or zinc. Electrodes can provide additional support for the glassy layers.

Figure 8:
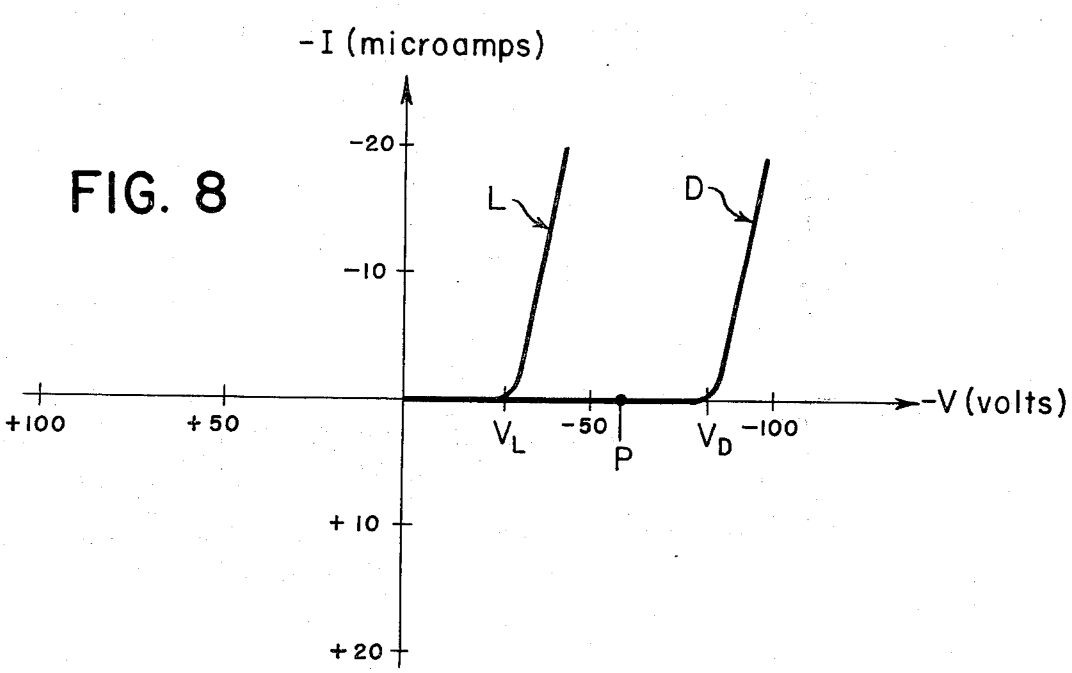
FIG. 8 is a graphical illustration showing the current-voltage characteristic of a typical diode of the form shown in FIG. 7.

It has been found that these junction devices exhibit a reverse bias avalanche breakdown characteristic which is dependent upon the presence or absence of incident light. This characteristic can be seen by reference to FIG. 8 which shows both the light and the dark breakdown characteristics for a typical device. Specifically, Curve D shows the dark breakdown characteristic, and Curve L shows the characteristic in the presence of light. It should be noted that, in contrast with conventional crystalline semiconductor devices, applicant's junction device retains low values of leakage current in the presence of light up to the breakdown voltage. It should also be noted that by biasing the electrodes through biasing means 75 so that the voltage across the diode is at some point P between the light breakdown voltage $V_L$ and the dark breakdown voltage $V_D$ an extremely sensitive photodiode is produced. A second unique advantage of this device is the fact that visible light can readily penetrate the glassy layer to the junction region. Other more specialized devices can be produced which take advantage of other unique features of these junction devices.

Figure 9:
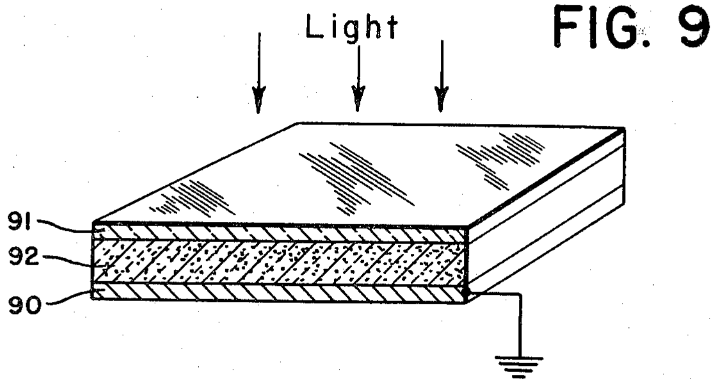
FIG. 9 illustrates a junction device for electrostatic reproduction.

FIG. 9 illustrates a second device useful as an electrostatic image reproducing element somewhat like a photoconductive plate. This element is similar to the junction device of FIG. 7 except that it has only one electrode 90. Specifically, the device comprises a layer 91 of the glassy amorphous material having one type of conductivity such as the above described 6:1:6 lead-alumino-silicate glass, disposed upon a semiconductive substrate 92 having the other kind of conductivity, e.g., N-doped polycrystalline silicon. A layer of homogeneous glass of uniform thickness can be readily formed by the aforementioned sedimentation technique so that the plate has uniform electrical properties. A unique advantage of this junction device is the fact that, unlike conventional junction devices which are limited in area due to the presence of grain boundaries, it can cover sufficiently large areas to be useful in document reproduction.

This device can be used in electrostatic reproduction by applying a charge to the glassy amorphous layer (e.g., by corona charging as described in U.S. Pat. No. 2,741,959 issued to L. E. Walkup) to a sufficient potential that the voltage across the glassy layer is between the light and dark breakdown voltages. A glass layer from 2 to 3 microns thick can be used with the 700 to 900 volt charging voltages typically used in xerography.

The device can then be exposed to the projected image of an original to be copied. The deposited charge will flow through the junction in the light areas of the projected image and remain on the surface in the dark areas. The resultant image can be developed using development techniques, such as cascade development, well known in the art of xerography.

I claim:

1. A photoresponsive junction device for sensing light of a given intensity comprising:

a semiconductor substrate having one type of conductivity;

disposed upon said semiconductor substrate a layer of an insulating ion impermeable glass having the other kind of conductivity from that of said substrate and containing a sufficient concentration of ionic impurities to possess useful conductivity;

said device possessing a reverse bias breakdown voltage which is dependent upon the presence or absence of light; and means for applying across the junction between said layer and said substrate a bias voltage of a value between the dark breakdown voltage and the breakdown voltage in the presence of light of said given intensity.

2. A device according to claim 1 wherein said ionic impurities are metallic ions.

3. A device according to claim 1 wherein said ionic impurities are metallic ions having more than one valence state.

4. A device according to claim 1 wherein said ionic impurities are ions of photoconductive material.

5. A device according to claim 1 wherein said glass is an oxidic glass.

6. A device according to claim 1 wherein said glass is an oxidic glass and said ionic impurities are metallic ions.

* * * * *